United States Patent
Hou et al.

(10) Patent No.: US 11,327,139 B2
(45) Date of Patent: May 10, 2022

(54) MEASUREMENT DEVICE FOR MEASURING A CURRENT CALIBRATION COEFFICIENT

(71) Applicant: Contemporary Amperex Technology Co., Limited, Ningde (CN)

(72) Inventors: Yizhen Hou, Ningde (CN); Zhimin Dan, Ningde (CN); Wei Zhang, Ningde (CN); Jia Xu, Ningde (CN)

(73) Assignee: Contemperary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 16/953,563

(22) Filed: Nov. 20, 2020

(65) Prior Publication Data

US 2021/0072336 A1 Mar. 11, 2021

Related U.S. Application Data

(63) Continuation of application No. 16/165,801, filed on Oct. 19, 2018, now Pat. No. 10,871,540.

(30) Foreign Application Priority Data

Oct. 23, 2017 (CN) .......................... 201710991638.X (51) Int. Cl.
*G01R 35/00* (2006.01)
*G01R 1/20* (2006.01)
*G01R 19/25* (2006.01)

(52) U.S. Cl.
CPC ........... *G01R 35/005* (2013.01); *G01R 1/203* (2013.01); *G01R 19/25* (2013.01)

(58) Field of Classification Search
CPC ....... G01R 1/203; G01R 19/25; G01R 35/005
See application file for complete search history.

(56) References Cited

U.S. PATENT DOCUMENTS

| | | | |
|---|---|---|---|
| 9,151,817 B1* | 10/2015 | Lakshmikanthan . | G01R 35/005 |
| 2005/0127918 A1* | 6/2005 | Kutkut ............... | G01R 31/3648 324/430 |
| 2013/0154672 A1* | 6/2013 | Fabregas ............. | G01R 35/005 324/713 |
| 2016/0341772 A1* | 11/2016 | Roberts ................ | G01R 35/005 |

* cited by examiner

*Primary Examiner* — Jay Patidar
(74) *Attorney, Agent, or Firm* — Law Offices of Liaoteng Wang (57) ABSTRACT

A measurement device includes: a host computer and a current source, wherein the host computer is configured to: control, when ambient temperature of a current detection device is at a preset temperature within an operation temperature range of a shunt of the current detection device, the current source to output a current with a preset current value to the current detection device; receive a calibrated current value sent by the current detection device; calculate a measurement error of the current detection device according to the preset current value and the calibrated current value; and instruct, when the measurement error is less than a preset current error, the current detection device to use the predetermined current calibration coefficient as a current calibration coefficient.

7 Claims, 8 Drawing Sheets

MEASUREMENT DEVICE FOR MEASURING A CURRENT CALIBRATION COEFFICIENT

CROSS-REFERENCE TO RELATED APPLICATION

The present application is a continuation of U.S. patent application Ser. No. 16/165,801, filed on Oct. 19, 2018, which claims priority to Chinese Patent Application No. 201710991638.X, filed on Oct. 23, 2017. The afore-mentioned patent applications are incorporated herein by reference in their entireties.

TECHNICAL FIELD

The present disclosure relates to the technical field of battery pack management, and in particular, to a measurement device and method for measuring a current calibration coefficient, and a current detection device and method.

BACKGROUND

Electric vehicles, taking the place of fuel vehicles, have become the trend of development of automotive industry. For use of an electric vehicle, continue voyage course, lifetime and safety of a battery pack are very important. Thus, it is necessary to provide a current detection device in the electric vehicle in order to detect a current value of the battery pack during charging and discharging so as to calculate, based on the detected current value, state of charge (SOC) (i.e. current available capacity) of the battery pack.

Depending on principles for current measurement, conventional current detection devices for use in an electric vehicle mainly adopt three principles, i.e. Hall Effect, fluxgate and shunt. A current sensor utilizing a Hall Effect or a fluxgate acquires a sampled current value based on mutual transformation between current and magnetic field, so its current sampling may be greatly impacted by an external electromagnetic interference and it has a higher cost. Thus, a shunt is generally used for implementing current measurement. A shunt is actually a resistor with a very small resistance value. When a direct current flows through the shunt, a voltage drop is resulted. By measuring the voltage drop across the shunt, a current though the shunt can be obtained.

It is simple to implement current measurement based on a shunt, but an analog-to-digital conversion circuit is required in the current detection device based on a shunt to perform an analog-to-digital conversion on an acquired voltage analog signal of the shunt, and during the conversion, an error may be existed between a converted voltage value and an actual sampled value, resulting in an error of a measured current value and low measurement precision in the current measurement for a battery pack.

SUMMARY

The embodiments of the present disclosure provide a measurement device and method for measuring a current calibration coefficient, and a current detection device and a method. With the devices and methods, it is possible to measure a current calibration coefficient for a current detection device, based on which accuracy of current detection can be effectively improved.

According to an aspect of the present disclosure, there is provided a measurement device for measuring a current calibration coefficient in embodiments of the present disclosure. The measurement device includes a host computer and a current source.

The current source is connected in series with a shunt of a current detection device to be calibrated. The current detection device further includes: a voltage acquisition unit for acquiring a voltage analog signal of the shunt, a voltage analog-digital conversion unit for performing an analog-digital conversion on the voltage analog signal to obtain a voltage value, a current calculation unit for calculating, according to the voltage value and a nominal resistance value of the shunt, a detected current value, and a power supply unit for supplying an operating power for the current detection device.

The host computer is configured to send a current output instruction to the current source, control the current source to output a current with a specified current value, calculate a current calibration coefficient according to the specified current value and the detected current value calculated by the current calculation unit, the current calibration coefficient is used for calibrating the current value calculated by the current calculation unit when the current detection device is applied in a circuit for current detection.

The current source is configured to receive the current output instruction, and output a current with the specified current value in response to the current output instruction.

According to an aspect of the present disclosure, there is provided a measurement method for measuring a current calibration coefficient based on the measurement device in embodiments of the present disclosure. The method includes: connecting a shunt of a current detection device to be calibrated in series with a current source; controlling the current source to output a current with a specified current value and acquiring a detected current value calculated by a current calculation unit of the current detection device to be calibrated; and calculating a current calibration coefficient for the current detection device according to the specified current value and the detected current value.

According to an aspect of the present disclosure, there is provided a current detection device in embodiments of the present disclosure. The current detection device includes a power supply unit for supplying an operating power for the current detection device. The current detection device further includes: a shunt connected in series in a circuit that needs current detection; a voltage acquisition unit configured to acquire a voltage analog signal of the shunt; a voltage analog-digital conversion unit configured to perform an analog-digital conversion on the voltage analog signal and input a converted voltage value to a current calculation unit; the current calculation unit configured to calculate a current value $I_0$ of the circuit according to the voltage value and a nominal resistance of the shunt and input the $I_0$ to a current calibration unit; and the current calibration unit configured to calibrate the $I_0$ according to a pre-stored current calibration coefficient to obtain a calibrated current value I, wherein the current calibration coefficient is obtained by connecting the shunt in series with the current source and calculating, according to a specified current value outputted by the current source and a detected current value calculated by the current calculation unit when a current with the specified current value flows through the shunt.

According to another aspect of the present disclosure, there is provided a current detection method based on the current detection device in embodiments of the present disclosure. The current detection method includes: connecting the shunt of the current detection device in series in a circuit that needs current detection; acquiring a current value calculated by the current calculation unit; and performing, by the current calibration unit, a calibration on the calculated current value according to a pre-stored current calibration coefficient to obtain a calibrated current value.

According to another aspect of the present disclosure, there is provided a battery pack in embodiments of the present disclosure. The battery pack includes the current detection device according to embodiments of the present disclosure, and wherein the circuit is a charge or discharge circuit of the battery pack.

According to another aspect of the present disclosure, there is provided a battery management system in embodiments of the present disclosure. The battery management system includes the current detection device according to embodiments of the present disclosure.

According to the measurement device and method for measuring a current calibration coefficient, and the current detection device and the method according to embodiments of the present disclosure, it is possible to measure a current calibration coefficient for a current detection device based on principle of a shunt by performing a test on the current detection device, and enable the current detection device to calibrate, after an initial detected current result is obtained by calculation of a current calculation unit, the detected current value according to the current calibration coefficient so as to bring the calibrated current value closer to a real current in the circuit. With the measurement device and method for measuring current calibration coefficient, it is possible to provide a novel scheme for measuring a current calibration coefficient for a current detection device. Compared with the device and method in prior arts, an error in a current detection result caused by the current detection device itself can be efficiently reduced, and thus accuracy of current detection can be improved.

BRIEF DESCRIPTION OF THE DRAWINGS

Other features, objects, and advantages of the present disclosure will become more apparent by reading the following detailed description of non-limiting embodiments with reference to the attached drawings, in which the same or similar reference signs denote the same or similar features.

DETAILED DESCRIPTION

The features and exemplary embodiments of the various aspects of the present disclosure will be described in detail below. In the following detailed descriptions, numerous specific details are set forth in order to provide a thorough understanding of the present disclosure. It will be apparent, however, to those skilled in the art that the present disclosure may be practiced without the need for some of the specific details. The following description of the embodiments is merely for providing a better understanding of the present disclosure by showing examples of the present disclosure. The present disclosure is in no way limited to any particular configuration and algorithm set forth below, but covers any alterations, substitutions and improvements of the elements, components and algorithms without departing from the spirit of the present disclosure. In the drawings and the following descriptions, well-known structures and techniques are not shown in order to avoid unnecessarily obscuring the present disclosure.

Figure 1:
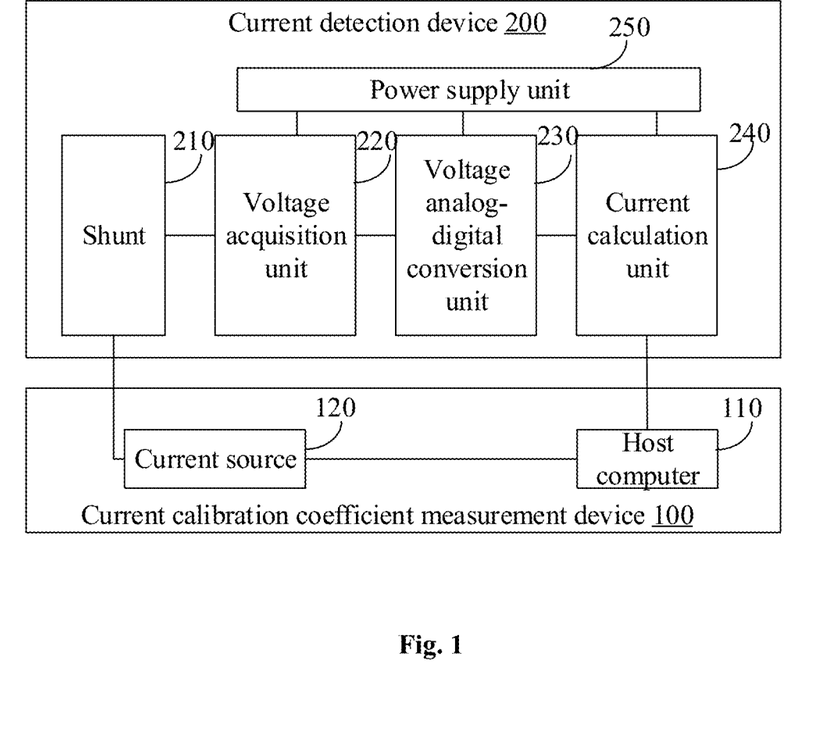
FIG. 1 is a schematic structural diagram of a current calibration coefficient measurement device according to an embodiment of the present disclosure.

FIG. 1 shows a schematic structural diagram of a current calibration coefficient measurement device according to an embodiment of the present disclosure. It can be seen from the figure that the current calibration coefficient measurement device 100 mainly includes a host computer 110 and a current source 120.

The current source 120 is connected in series with a shunt 210 of the current detection device 200 to be calibrated and is configured to outputs a current with a specified current value in response to a current output instruction from the host computer 110.

The current detection device 200 further comprises: a voltage acquisition unit 220 for acquiring a voltage analog signal across the shunt 210 (the shunt 210 is connected in series with the current source 120 such that a voltage drop is generated after a current outputted by the current source 120 flows through the shunt 210, and the voltage acquisition unit 220 samples voltage across the shunt 220 to obtain the voltage analog signal), a voltage analog-digital conversion unit 230 for performing an analog-digital conversion on the voltage analog signal to obtain a voltage value, a current calculation unit 240 for calculating, according to the voltage value converted by the voltage analog-digital conversion unit 230 and a nominal resistance value of the shunt 210, a detected current value, and a power supply unit 250 for supplying an operating power for the current detection device 100. The power supply unit 250 supplies power to various modules (including the voltage acquisition module 220, the voltage analog-to-digital conversion unit 230, the current calculation unit 240, etc.) of the current detection device 100 that needs an operating power.

The host computer 110 is configured to send a current output instruction to the current source 120, control the current source 120 to output a current with a specified current value, calculate, according to the specified current value and a detected current value calculated by the current calculation unit 240, a current calibration coefficient of the current detection device 200 for calibrating the current value calculated by the current calculation unit 240 when the current detection device 200 is used for current detection in a circuit.

With the current calibration coefficient measurement device 100 according to the embodiment of the present disclosure, it is possible to perform, before the current detection device 200 is used for current measurement in the circuit, a test on the current detection device 200 to obtain a current calibration coefficient of the current detection device 200, so that the current detection device 200 can calibrate the current value in the circuit calculated by the current calculation unit 240 according to the current calibration coefficient to obtain a result that is closer to an actual current value of the circuit, and thereby accuracy of current detection by the current detection device 200 in the circuit can be improved.

It should be noted that the detection for the detected current value in the embodiment of the present disclosure is merely used to illustrate that the current value is calculated by the current calculation unit 240 of the current detection device 200. The current source 120 serves as a reference current source of the measurement device. The current source 120 may be a high-precision current source, that is, its output error is sufficiently low, for example, generally less than 1‰ or less.

In order to avoid a problem that the current calibration coefficient is not accurate or unusable due to an accidental error caused by a single measurement (i.e. only one specified current value is output) and a too big error caused by other interferences, the host computer 110 in an embodiment of the present disclosure may be specifically configured to control the current source 120 to sequentially output currents with n different specified current values, and calculate the current calibration coefficient according to the n different specified current values and n corresponding detected current values, wherein N≥2.

When the current detection device 200 performs current detection based on the shunt 210, an error in the current value calculated by the current calculation unit 240 may be generated mainly due to an error caused by the shunt 210 and an error caused by the voltage analog-to-digital conversion unit 230 (generally, an analog-to-digital converter (ADC) is used).

For the error caused by the voltage analog-to-digital conversion unit 230, it may include an accidental error and a systematic error. The accidental error, such as a quantization error of the ADC, cannot be eliminated by calibration, while the systematic error can be calibrated by some calculations in order to get a measured value closer to an actual value. The systematic error of the ADC may include an offset error (zero error) and a gain error.

Figure 2:
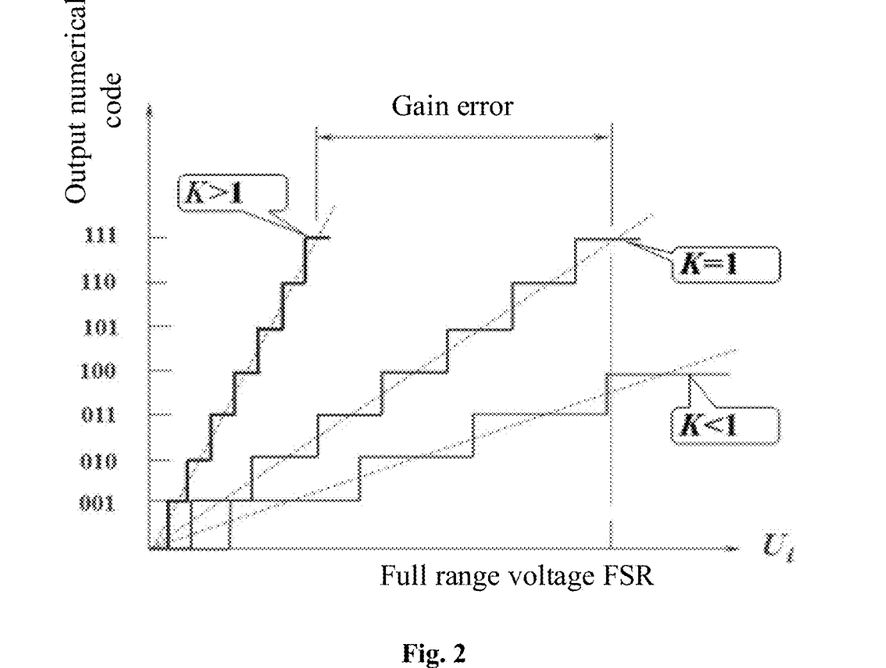
FIG. 2 is a schematic diagram illustrating a gain error curve of an analog-to-digital converter according to an embodiment of the present disclosure.

FIG. 2 shows variation of a gain error over a full range of an ADC (without considering errors and non-linearity of other sources). As shown in the figure, K represents the ADC's gain error factor (gain coefficient). The middle solid curve in the figure is the ADC's ideal transmission characteristic curve. If the ADC's analog input and digital output have the same increment respectively in x-axis and y-axis, its transmission characteristic is shown by the middle dashed line, that is, K=1. However, the ADC's actual transmission characteristic may be not the same. The ADC's actual transmission characteristic curve may be a solid curve corresponding to K>1 or a solid curve corresponding to K<1. The difference between the dashed line for K≠1 and the dashed curve for K=1 is an gain error, that is, the current calibration coefficient measured by the current calibration coefficient measurement device according to the embodiment of the present disclosure performing a test on the current detection device. The current calibration coefficient is used for calibrating the current value so as to minimize or eliminate the error.

From the curves about the gain error shown in FIG. 2, it can be seen that the gain error can be corrected by using a suitable linear coefficient (that is, a linear relationship between a calibrated value and a value to be calibrated) to make an actual error curve is substantially coincide with the ideal curve, so that the gain error can be reduced or eliminated. The offset error of an ADC is substantially a constant at a certain temperature, and most offset error can be eliminated by shifting to zero. Therefore, the offset error can be calibrated by a constant coefficient.

The error in current detection result caused by the shunt 210 includes an error caused by difference between a nominal resistance value of the shunt itself (that is, a resistance value marked on a surface of the device) and its actual resistance value (simply referred to as an error in resistance of the shunt). For the error in resistance of the shunt, since a current detection device based on a shunt uses the Ohm's law, that is, $$I_v = \frac{V_d}{R_s} \tag{1}$$

where $I_t$ denotes a measured current value; $U_d$ denotes a voltage drop across the shunt; $R_s$ denotes a typical resistance (i.e. a nominal resistance) of the shunt, the error in current measurement value Err caused by the resistance of the shunt is as follows:

$$Err = \frac{n}{100 \pm n} \approx n\,\% \tag{2}$$

where n % is an error in an actual resistance Ra of the shunt.

For the same shunt 210, the shunt's resistance error can be considered as a constant, which has the impact of Err on accuracy of sampling values in the entire current detection results, so the error caused by an error in the shunt's resistance can be efficiently eliminated by shifting a measured accurate value to the zero by |Err|. Therefore, the error in the shunt's resistance can be eliminated by a constant coefficient (i.e., a constant term)

It can be seen that for the error in current detection result of the current detection device 200 due to errors in the voltage analog-to-digital conversion unit 230 and the shunt's resistance can be calibrated by a linear coefficient and a constant coefficient. Therefore, the calibration can be achieved by a linear function.

Based on the above principle, in an embodiment of the present disclosure, the host computer 110 is specifically configured to calculate, according to the n different specified current values and n corresponding detected current values, the current calibration coefficient by a least-square linear fitting method. The current calibration coefficient includes a linear calibration coefficient A and a constant calibration coefficient B.

The least-square method is a mathematical optimization technique that minimizes a total fitting error by minimizing square of an involved error and finding a best matched function for data. Therefore, in an embodiment of the present disclosure, the host computer 110 calculates the current calibration coefficient by using the least-square linear fitting method, so as to obtain a current calibration coefficient that enables the detected current value has a good match with the specified current value. It can be known from characteristics of the least-square linear fitting method that the current calibration coefficient is obtained based on the method includes two coefficient, that is, a linear calibration coefficient A and a constant calibration coefficient B.

In an embodiment of the present disclosure, n different specified current values are $y_1, y_2, \ldots, y_n$. The host computer 110 controls the current source 120 to sequentially output the n specified current values such that n currents sequentially flow through the shunt 210, the voltage acquisition unit 220, the voltage analog-to-digital conversion unit 230, and the current calculation unit 240 for corresponding process. The current calculation unit 240 then calculates n detected current values $(x_1, x_2, \ldots, x_n)$ corresponding to $y_1, y_2, \ldots, y_n$. In this way, n pairs of current data, i.e., $(x_1, y_1)$, $(x_2, y_2), \ldots, (x_n, y_n)$ are obtained for calculating the current calibration coefficient. According to n pairs of current data, a straight line is fit out by using the least square method:

$$y = Ax + B \quad (3)$$

Let $$\bar{x} = \frac{x_1 + x_2 + x_3 + \ldots + x_n}{n} \quad (4)$$

$$\bar{y} = \frac{y_1 + y_2 + y_3 + \ldots + y_n}{n} \quad (5)$$

$$C = (x_1 - \bar{x})^2 + (x_2 - \bar{x})^2 + (x_3 - \bar{x})^2 + \ldots + (x_n - \bar{x})^2, \quad (6)$$

it can be determined that:

$$A = \frac{(x_1 - \bar{x})(y_1 - \bar{y}) + (x_2 - \bar{x})(y_2 - \bar{y}) + (x_2 - \bar{x})(y_2 - \bar{y}) + \ldots + (x_n - \bar{n})(y_n - \bar{n})}{c}, \quad (7)$$

$$B = \bar{y} - A\bar{X} \quad (8)$$

The linear calibration coefficient A and the constant calibration coefficient B of the current calibration coefficient can be calculated based on formulas (3)-(8).

After the calibration coefficients A and B are calculated by the host computer 110 and when the current detection device 200 is used in a circuit (such as a charging or discharging circuit of a battery pack) for current detection, the current detection device 200 can realize calibration of a current value calculated by its current calculation unit 240 according to the current calibration coefficient. Specifically, assuming that the current value in a charging/discharging circuit calculated by the current calculation unit 240 is $I_1$, the current value $I_2$ after calibration using the current calibration coefficient calculated by the measurement device is $I_2 = AI_1 + B$.

Figure 3:
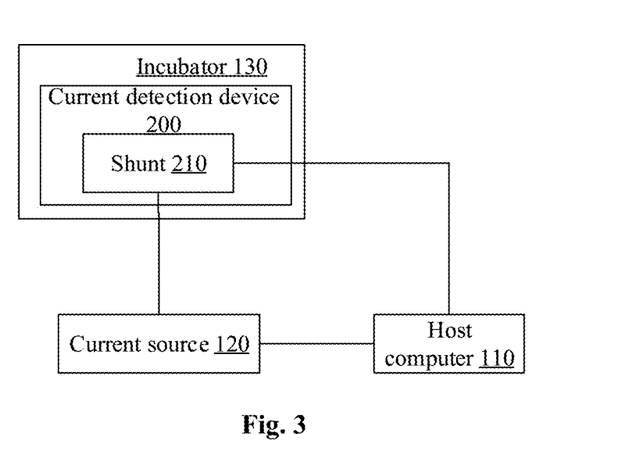
FIG. 3 is a schematic structural diagram of a current calibration coefficient measurement device according to another embodiment of the present disclosure.

In an embodiment of the present disclosure, the current calibration coefficient measurement device 100 may further include an incubator 130 for placing the current detection device 200, as shown in FIG. 3.

The host computer 110 is specifically configured to control the current source 120 to output a current with a specified current value when temperature of the incubator 130 is at a reference temperature $T_1$ according to a resistance-temperature characteristic of the shunt 210, and calculate, according to the specified current value and a detected current value at $T_1$ calculated by the current calculation unit 240, a current calibration coefficient at $T_1$.

The host computer 110 is further configured to determine, according to the current calibration coefficient at $T_1$ and a resistance-temperature characteristic curve of the shunt 210, current calibration coefficients at respective temperatures other than $T_1$ in an operation temperature range of the shunt 210 so as to obtain a mapping relationship between temperatures of the shunt and current calibration coefficients.

In an embodiment of the present disclosure, the host computer 110 is further configured to control the current source 120 to output a current with a specified current value when the incubator 130 is in a temperature $T_2$, calculate, according to the specified current value, the detected current value at $T_1$ and the nominal resistance value of the shunt 210, a first actual resistance value $R_1$ of the shunt at $T_1$, calculate, according to the specified current value, a detected current value at $T_2$ and the nominal resistance value of the shunt 210, a second actual resistance value $R_2$ of the shunt at $T_2$, calculate, according to the $R_1$ and $R_2$, a resistance change rate (i.e., a resistance-temperature coefficient) of the shunt 210 at $T_2$, and determines a resistance change rate curve (i.e., a resistance-temperature characteristic curve) of the shunt 210 based on the resistance change rate at $T_2$ and a resistance change rate at $T_1$, wherein $T_2$ is not equal to $T_1$.

For calculation of the first actual resistance value $R_1$ of the shunt by the host computer 110 according to the specified current value, the detected current value at $T_1$ and the nominal resistance value of the shunt 210, the detected current value at $T_1$ is multiplied by the nominal resistance value of the shunt 210 and then its product is divided by the specified current value corresponding to the detected current value. Similarly, the second actual resistance $R_2$ can be obtained by multiplying the detected current value at $T_2$ by the nominal resistance value of the shunt 210 and then dividing its product by the specified current value corresponding to the detected current value at $T_2$.

In practical applications, if the host computer 110 controls the current source 120 to output n different specified current values and there are n corresponding detected current values, different selections may be made as actually required for calculation of an actual resistance value of the shunt 210. For example, one of the n pairs of specified current values and detected current values may be used for calculation. Alternatively, each of the n pairs of specified current values and detected current values may be used for calculation separately and then an average of the n calculated results is used finally as the actual resistance value.

It should be noted that in an embodiment of the present disclosure, the temperature $T_1$ is at the reference temperature according to the resistance-temperature characteristic of the shunt 210, that is, a temperature when its resistance-temperature coefficient is regarded as zero. In general, the reference temperature may be selected as 20° C. or 25° C. The temperature $T_2$ may be any temperature other than $T_1$ in the operating temperature range of the shunt 210. Preferably, it may be a temperature that has a difference from $T_1$ greater than a set value to prevent the two temperatures from being too close to cause accuracy of a determined resistance change rate curve is not high enough. The operating temperature range of the shunt 210 is a temperature range at which the shunt 210 can operate normally. The temperature range can be determined based on empirical or experimental values or an operating temperature range noted on the device.

In practical applications, when the current flowing through the shunt 210 is large, the shunt 210 may generate a heating phenomenon, which may cause a change in the shunt's resistance, that is, a temperature drift, and may affect the current detection result of the current detection device 200.

That is to say, the influence of the shunt 210 on the current detection result may also include an error caused by change in the shunt's resistance value under different ambient temperatures (referred to as temperature error of the shunt).

In order to further improve accuracy of the current calibration coefficient measurement, in the embodiment of the present disclosure, temperature of the current detection device 200 is controlled by the incubator 130 such that change in the resistance of the shunt 210 caused by a temperature change is measured so as to obtain a mapping relationship between temperatures of the shunt and current calibration coefficient. When current calibration is performed, it is possible to find, according to current temperature of the shunt 201, a current calibration coefficient corresponding to the temperature, and thereby influence caused by temperature drift can be reduced and accuracy of calibration can be improved.

In practical operation, the host computer 110 may further calculate, according to the specified current value and the detected current value at $T_2$, the current calibration coefficient at $T_2$. Then, the host computer 110, when calculating current calibration coefficients at respective temperatures other than $T_1$ in the operating temperature range according to the current calibration coefficient at $T_1$ and the resistance-temperature characteristic curve, does not need to calculate the current calibration coefficient at $T_2$ in the operating temperature range.

Figure 4:
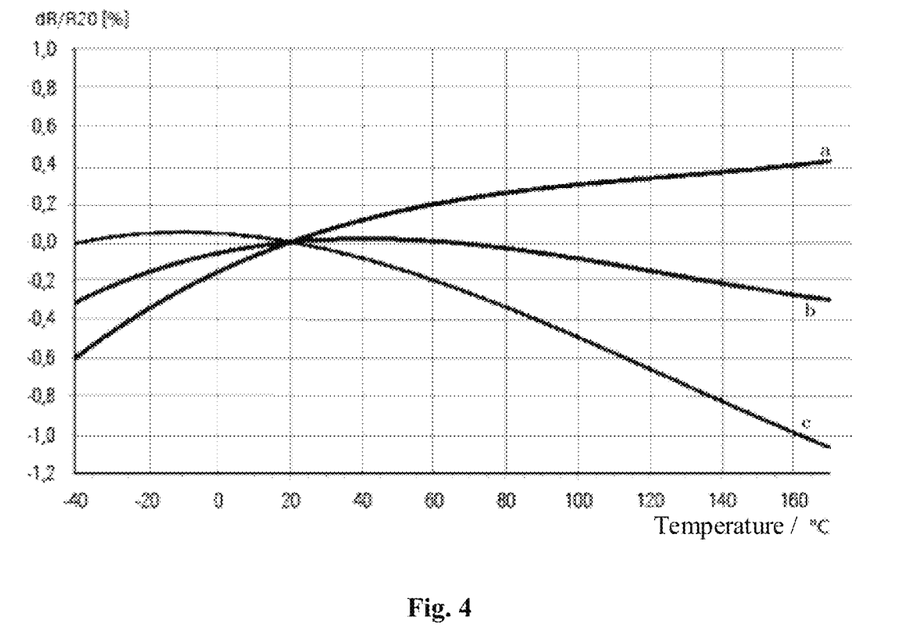
FIG. 4 is a schematic diagram illustrating a resistance-temperature characteristic curve of a shunt according to embodiments of the present disclosure.

FIG. 4 shows resistance-temperature characteristic curves under three different temperature coefficient of resistances (TCR). In the figure, the abscissa shows temperatures, and the ordinate shows resistance change rates repeating resistance changes every time the temperature changes by 1° C., wherein the reference temperature is at 20° C. The Curve a is a resistance-temperature characteristic curve (i.e., a resistance change rate curve) under TCR of 50 ppm/k, the Curve b is a resistance-temperature characteristic curve under TCR of 0 ppm/k, and the Curve c is a resistance-temperature characteristic curve under TCR of −50 ppm/k. As can be seen from the three curves, they have substantially consistent shape change trend, and rotate around the point of the reference temperature of 20° C. Assuming $T_1$ is at 20° C., if the resistance change rate at $T_2$ is measured, a resistance-temperature characteristic curve of the shunt 210 in the temperature section from $T_1$ to $T_2$ can be determined. After resistance-temperature characteristic curve is determined, the resistance at other temperatures can be calculated based on the resistance at the reference temperature.

Specifically, taking an actual resistance value $R(T_1)$ at a temperature point $T_1$ as a reference value and an actual resistance value at another temperature value $T_2$ being measured as $R(T_2)$, a change rate $\Delta R \%$ regarding resistance values at the two temperature points $T_1$ and $T_2$ (i.e., a resistance change rate at $T_2$) can be determined according to the temperatures $T_1$ and $T_2$ and corresponding resistance values therefor, that is:

$$\Delta R \% = \frac{R(T_2) - R(T_1)}{R(T_1)} \tag{9}$$

Taking the temperature $T_1$ as the reference temperature, a curve of resistance values of the shunt versus temperatures (i.e., a resistance change rate curve of the shunt in the operating temperature range) can be determined based on the resistance change rate at $T_2$.

According to Ohm's law (formula (1)), a change in resistance value has a linear effect on current value. Therefore, an error due to a temperature error (i.e. change in resistance value) of the shunt will bring effect on a linear calibration coefficient to some extent. The linear calibration coefficient at the reference temperature, i.e., $T_1$ can be corrected according to determined changes in resistance value at different temperatures. Thus, current calibration coefficients at respective temperatures can be obtained through a resistance change rate curve and a known current calibration coefficient at $T_1$ so as to obtain the mapping relationship. Therefore, the influence caused by the temperature drift can be reduced, temperature compensation can be achieved, and accuracy of current detection in the operating temperature range of the current detection device can be improved.

In an embodiment of the present disclosure, the host computer 110 is specifically configured to determine, when the current calibration coefficient at $T_1$ is calculated by the least-square linear fitting method, a third actual resistance value $R_3$ of the shunt 210 at a temperature T other than the $T_1$ in the operating temperature range according to the temperature T and the resistance-temperature characteristic curve, and calculate a current calibration coefficient at T according to the $R_3$ and the current calibration coefficient at $T_1$ by a formula below:

$$A_3 = A_1 * R_3 / R_1, B_3 = B_1 \tag{10}$$

where $A_1$ is a linear calibration coefficient at $T_1$, $A_3$ is a linear calibration coefficient at T, $B_1$ is a constant calibration coefficient at $T_1$, and $B_3$ is a constant calibration coefficient at T.

Figure 5:
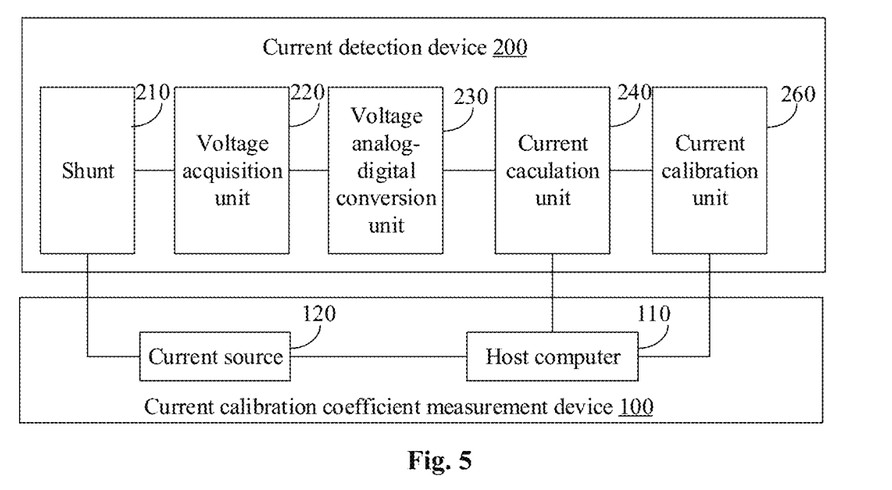
FIG. 5 is a schematic structural diagram of a current calibration coefficient measurement device according to still another embodiment of the present disclosure.

In an embodiment of the present disclosure, the current detection device 200 to be tested may further include a current calibration unit 260 as shown in FIG. 5 (the power supply unit 250 is not shown in the figure).

The host computer 110 is further configured to send the current calibration coefficient to the current calibration unit 260.

The current calibration unit 260 is configured to receive and store the current calibration coefficient.

The power supply unit 250 is further used to provide an operating power for the power calibration unit 260.

According to the current calibration coefficient measurement device 100 in the embodiment of the present disclosure, the host computer 110, after obtaining the current calibration coefficient, may write the current calibration coefficient into the current calibration unit 260 of the corresponding current detection device 200. When the current detection device 200 is used in a circuit for current detection, the current calibration unit 260 can calibrate and correct, according to the stored current calibration coefficient, the current value calculated by the current calculation unit 240 so as to effectively improve accuracy of the current detection in the circuit.

In an embodiment of the present disclosure, the host computer 110 is further configured to control the current source 120 to output a current with a preset current value after sending the current calibration coefficient to the current calibration unit 260, and receive a calibrated current value sent by the current calibration unit 260, calculate a measurement error of the current detection device according to the preset current value and the calibrated current value, and determine, if the measurement error is less than a preset current error, the current calibration coefficient as the current calibration coefficient of the current calibration unit 260.

The current calibration unit 260 is further configured to calibrate a detected current value calculated by the current calculation unit 240 and corresponding to the preset current value according to the current calibration coefficient to obtain a calibrated current value, and send the calibrated current value to the host computer 110.

In the embodiment of the present disclosure, the host computer 110 writes the current calibration coefficient into the current calibration unit 260 after the current calibration coefficient calculation is obtained, and then control the current source 120 to output a current with a preset current value, and the current calibration unit 260 calibrates a detected current value calculated by the current calculation unit 240 and corresponding to the preset current value to obtain a calibrated current value. According to the calibrated current value and the preset current value, a determination is made as to whether the test accuracy of the current detection device 200 now meets a preset requirement, that is, whether the measurement error is less than a preset current error. If the preset requirement is satisfied, the current calibration coefficient can be used as a calibration coefficient for an actual current detection of the current calibration unit 260. If the preset requirement is not satisfied, it shows that the current calibration coefficient does not meet the measurement precision requirement or the current detection device 200 does not meet a test precision requirement, and thus a current calibration coefficient for the current calibration unit 260 should be re-measured or it is directly determined that the current detection device 200 has a too large detection error to be used for current detection in a circuit.

In the embodiment of the present disclosure where the host computer 110 calculates both the current calibration coefficient at $T_1$ and the current calibration coefficient at $T_2$, precision of respective current calibration coefficients at both temperatures needs to be respectively detected. In this case, both the current calibration coefficients at the two temperatures should respectively meet the measurement precision requirement.

It should be noted that in practical operations, the current calibration unit 260, after receiving the current calibration coefficient, may be controlled by the host computer 110 to calibrate a detected current value calculated by the current calculation unit 240 according to the current calibration coefficient to obtain a calibrated current value. For calibration by the current calibration unit 260, the detected current value may be a detected current value that is a current value of a current with the specified current value re-output by the current source 120 under control of the host computer 110 and subjected to sampling by the current sampling unit 220, processing by the analog-to-digital conversion unit 230 and the current calculation unit 240 and calculation by the current calculation unit 240, and may also be a detected current value that has been calculated by the current calculation unit 240 for measure of the current calibration coefficient. That is to say, the current detection device 200 having a current calibration coefficient written therein may be tested again by the current calibration coefficient measurement device 100, to determine whether detection precise of the current detection device 200 meets a requirement based on a specified current value output by the current source and a calibrated current value output by the current calibration unit 260 at present time. Alternatively, the current calibration unit 260 directly performs a calibration on a detected current value obtained before the current calibration coefficient is written, and a determination is made based a calibrated current value and a corresponding specified current value.

In an embodiment of the present disclosure, the current source 120 may be further configured to send an actual current value output by the current source 120 to the host computer 110 after outputting a current with a specified current value in response to the current output instruction.

In this case, the host computer 110 is specifically configured to calculate the current calibration coefficient of the current detection device 200 according to the detected current value and the actual current value corresponding to the specified current value.

In practical applications, since an actual output current value of a high-precision current source 120 may not be exactly the same as the specified current value in the current output instruction, it is possible for some existing high-precision current sources to output a current according to the current output instruction from the host computer 110, and then feedback an actual output current value corresponding to the specified current value requested by the instruction to the host computer 110. Therefore, in order to further improve the calculation precision of the current calibration coefficient, in embodiments of the present disclosure, the host computer 110 preferably performs a calculation of the current calibration coefficient according to an actual current value corresponding to the specified current value feedback by the current source 120 and the detected current value calculated by the current calculation unit 240.

It should be noted that in practical applications, the calibration coefficient measurement device 100 in embodiments of the present disclosure may be used only before the current detection device 200 is applied in a circuit for current detection or when the current detection device 200 needs to be recalibrated.

Each of components of the current calibration coefficient measurement device 100 and the current detection device 200 according to embodiments of the present disclosure may be specifically implemented according to actual requirements and is not limited to any specific form. The components may be separately implemented, or may be implemented in integration of two or more components. For example, each of the units of the detection device may be implemented by a chip or a processor, and may also be implemented by a corresponding functional circuit or other forms. In an example, the current calculation unit 240 and the current calibration unit 260 of the current detection device 200 may be separately implemented in a chip. In another example, the current calculation unit 240 and the current calibration unit 260 may be integrated into one chip, such as a micro control unit (MCU), which performs both current calculation and current calibration.

It should be noted that in practical applications, the current detection device 200 may generally have some front-end processing units before the voltage analog-to-digital conversion unit 230, such as a filtering circuit and/or an amplifying circuit, in order for performing processes on the voltage analog signal before the analog signal is input to the analog-to-digital conversion unit 230, so as to enable the inputted signal to satisfy signal processing requirements of the voltage analog-to-digital conversion unit 230.

Figure 6:
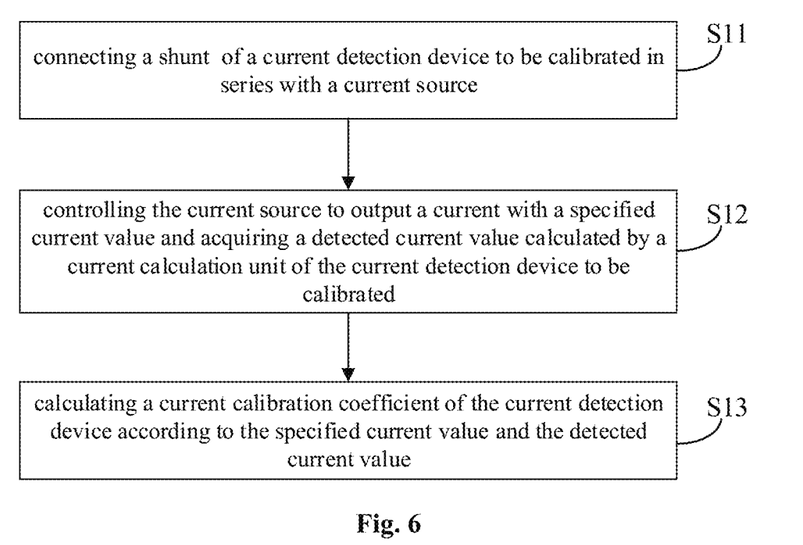
FIG. 6 is a flow chart of a method for measuring a current calibration coefficient according to an embodiment of the present disclosure.

Based on the current calibration coefficient measurement device according to embodiments of the present disclosure, there is also provided a current calibration coefficient measurement method in embodiments of the present disclosure, as shown in FIG. 6. The current calibration coefficient measurement method according to embodiments of the present disclosure may mainly include the following steps: in step S11: connecting a shunt of a current detection device to be calibrated in series with a current source; in step S12: controlling the current source to output a current with a specified current value and acquiring a detected current value calculated by a current calculation unit of the current detection device to be calibrated; and in step S13: calculating a current calibration coefficient of the current detection device according to the specified current value and the detected current value.

In an embodiment of the present disclosure, the controlling the current source to output a current with a specified current value and acquiring a detected current value calculated by the current calculation unit of the current detection device to be calibrated may include: controlling the current source to sequentially output currents with n different specified current values to obtain n detected current values output by the current calculation unit corresponding to the n different specified current values, wherein n≥2. The calculating a current calibration coefficient of the current detection device according to the specified current value and the detected current value may include: calculating the current calibration coefficient according to the n different specified current values and n corresponding detected current values.

In an embodiment of the present disclosure, the calculating the current calibration coefficient according to the n different specified current values and n corresponding detected current values comprises may include: calculating, according to the n different specified current values and the n corresponding detected current values, the current calibration coefficient by a least-square linear fitting method, wherein the current calibration coefficient comprises a linear calibration coefficient and a constant calibration coefficient.

In an embodiment of the present disclosure, the controlling the current source to output a current with a specified current value and acquiring a detected current value calculated by the current calculation unit of the current detection device to be calibrated may include: controlling the current source to output a current of the specified current value when ambient temperature of the current detection device is at a reference temperature $T_1$ according to a resistance-temperature characteristic of the shunt; and acquiring a detected current value at $T_1$ calculated by the current calculation unit. The calculating a current calibration coefficient of the current detection device according to the specified current value and the detected current value may include: calculating a current calibration coefficient at $T_1$ according to the specified current value and the detected current value at $T_1$.

In this case, the current calibration coefficient measurement method according to embodiments of the present disclosure may further include: determining, according to the current calibration coefficient at $T_1$ and a resistance-temperature characteristic curve of the shunt, current calibration coefficients at respective temperatures other than $T_1$ in an operating temperature range of the shunt to obtain a mapping relationship between temperatures of the shunt and current calibration coefficients.

In an embodiment of the present disclosure, the current calibration coefficient measurement method may further include: controlling the current source to output a current with the specified current value when the ambient temperature of the current detection device is at a temperature $T_2$, wherein $T_2$ is not equal to $T_1$; acquiring a detected current value at $T_2$ calculated by the current calculation unit; calculating, according to the specified current value, the detected current value at $T_1$ and a nominal resistance value of the shunt, a first actual resistance $R_1$ of the shunt; calculate, according to the specified current value, a detected current value at $T_2$, and the nominal resistance value of the shunt, a second actual resistance $R_2$ of the shunt; calculating a resistance change rate of the shunt at $T_2$ according to the $R_1$ and $R_2$, and determining the resistance-temperature characteristic curve of the shunt according to the resistance change rate at $T_2$ and a resistance change rate at $T_1$.

In an embodiment of the present disclosure, the determining current calibration coefficients at respective temperatures other than $T_1$ in the operating temperature range of the shunt according to the current calibration coefficient at $T_1$ and the resistance change rate of the shunt may include: determining, according to a temperature T other than $T_1$ in the operating temperature range and the resistance change rate curve, a third actual resistance $R_3$ at T of the shunt; calculating, according to the $R_3$ and the current calibration coefficient at $T_1$, a current calibration coefficient at T by a formula: $A_3 = A_1 * R_3/R_1$, $B_3 = B_1$, where $A_1$ is a linear calibration coefficient at $T_1$, $A_3$ is a linear calibration coefficient at T, $B_1$ is a constant calibration coefficient at $T_1$, and $B_3$ is a constant calibration coefficient at T.

In order to better illustrate the current calibration coefficient measurement device and the measurement method according to embodiments of the present disclosure, they are described in more derails below in connection with a specific embodiment.

Figure 7:
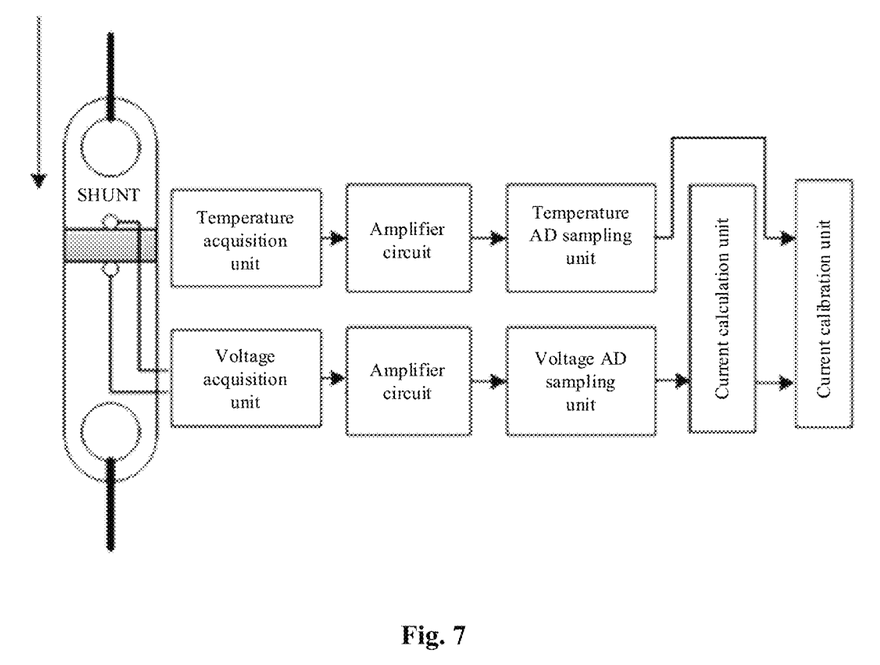
FIG. 7 is a schematic structural diagram of a current detection device to be calibrated according to a specific embodiment of the present disclosure.
Figure 8:
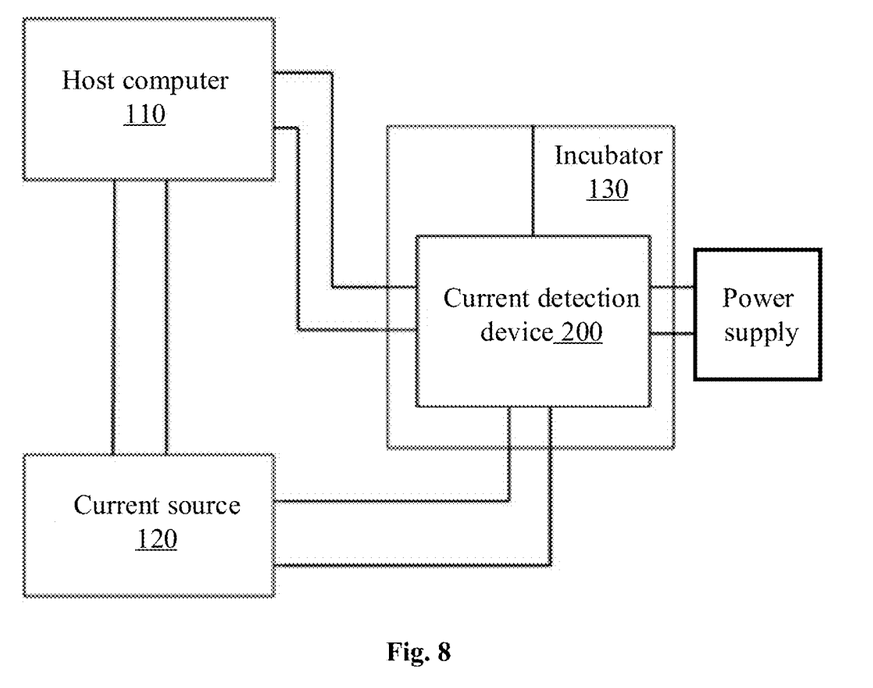
FIG. 8 is a schematic diagram illustrating a connection topology of a current calibration coefficient measurement device and a current detection device in a specific embodiment of the present disclosure.
Figure 9:
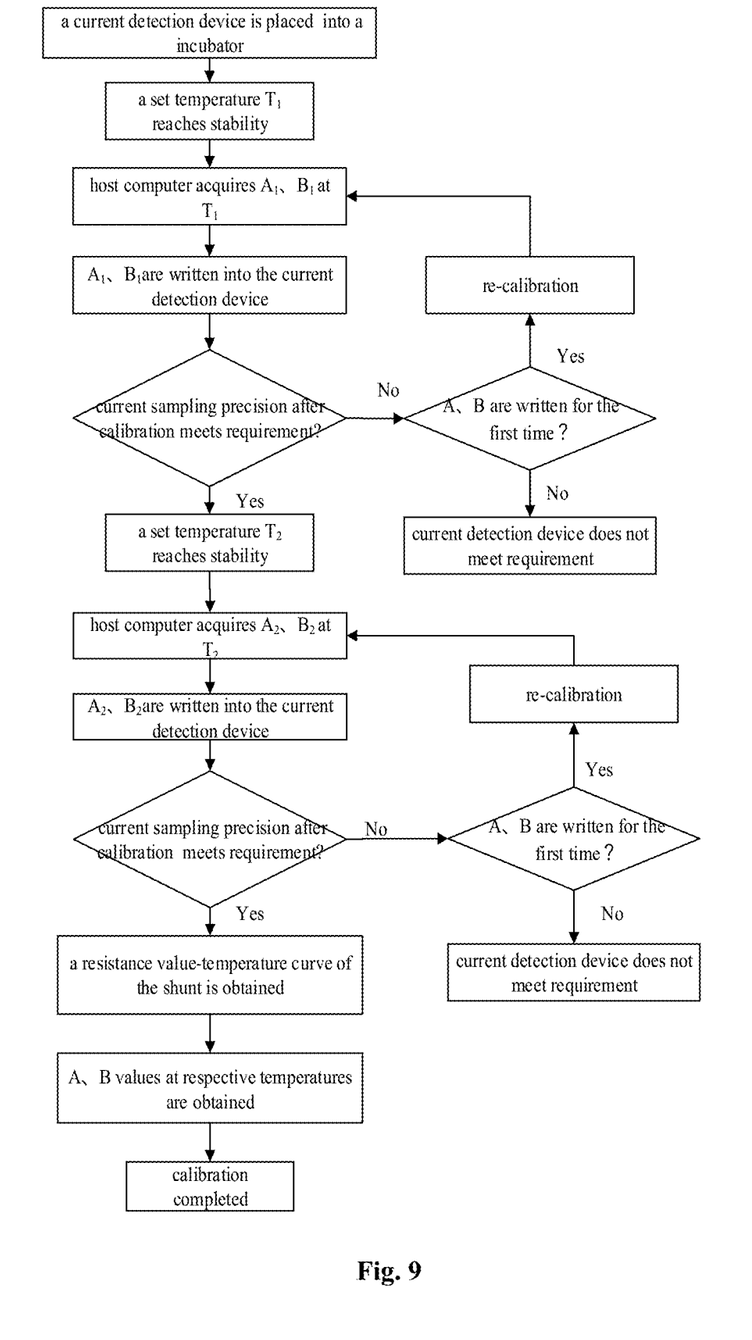
FIG. 9 is a flow chart of a current calibration coefficient measurement device measuring a current calibration coefficient according to an embodiment of the present disclosure.

FIG. 7 is a schematic structural diagram of a current detection device 200 to be calibrated in a specific embodiment. FIG. 8 is a topology diagram of a connection relationship between the current calibration coefficient measurement device 100 and the current detection device 200 in a specific embodiment. In the embodiment, the power supply unit is a power supply as shown in FIG. 8, and is used to provide an operating power for the current detection device 200. FIG. 9 shows a flow chart of the calibration coefficient measurement device 100 testing the current detection device 200 to obtain a current calibration coefficient for the current detection device 200 according to the embodiment.

It can be seen from FIG. 7 that the current detection device 200 of the embodiment can be divided into two parts, one part of which is a current sampling part for sampling a current in a circuit for current detection, another part is a temperature sampling part for sampling a temperature value of a shunt. The current sampling part includes a shunt, a voltage acquisition unit, an amplifier circuit, a voltage analog-to-digital (AD) sampling unit (i.e. voltage AD conversion unit) and a current calculation unit. The arrows in the figure indicate current directions in a charge/discharge circuit that needs current detection. The current calculation unit implements calculation of a current in the circuit and sends a calculated result to the current calibration unit. The temperature sampling part sends an acquired temperature value of shunt to the current calibration unit, and the current calibration unit realizes current value calibration according to the calculated current value and the temperature value. In order to improve temperature sampling precision, the temperature sampling part is disposed close to the center of shunt.

Before applying the current detection device 200 shown in FIG. 7 to an actual current circuit, the current detection device 200 is tested by the circuit topology shown in FIG. 8 to obtain a current calibration coefficient that meets a measurement accuracy requirement. As shown in FIG. 9, in this specific embodiment, the current calibration coefficient may be obtained mainly by the following steps:

a. the current detection device to be tested is placed in an incubator.

b. the temperature of incubator is controlled by the host computer or controlled manually to reaches a reference temperature $T_1$.

c a test is implemented by the host computer using the topology shown in FIG. 8 on the current detection device at the temperature $T_1$, to obtained a current calibration coefficients $A_1$ and $B_1$ at the temperature $T_1$, and $A_1$ and $B_1$ are written to the current calibration unit of the current detection device.

d. detection precision of the current detection device is determined by the host computer according to the written $A_1$ and $B_1$, to determine whether the detection precision of the current detection device under the calibration coefficients of $A_1$ and $B_1$ meets a preset precision requirement, and if yes, the $A_1$ And $B_1$ are determined as current calibration coefficients for the current calibration unit at the temperature $T_1$ and the flow goes to the next step. In the specific embodiment, acquisition of the current calibration coefficients may be performed a limited number of times, such as two times. As can be seen from the figure, if the detection precision does not meet the preset precision requirement, a determination as to whether to write the current calibration coefficients to the current calibration unit is made. If yes, the flow goes back to the step c for retest; if not, it is determined that the current detection device does not meet the current detection precision requirement, and the current detection device needs to be replaced.

e. the temperature of the incubator is controlled by the host computer or controlled manually to reach a set temperature $T_2$.

f. a test is implemented by the host computer using the topology shown in FIG. 8 on the current detection device at the temperature $T_2$, to obtained a current calibration coefficients $A_2$ and $B_2$ at the temperature $T_2$, and $A_2$ and $B_2$ are written to the current calibration unit of the current detection device.

g. detection precision of the current detection device is determined by the host computer according to the written $A_2$ and $B_2$, to determine whether the detection precision of the current detection device under the calibration coefficients of $A_2$ and $B_2$ meets a preset precision requirement, and if yes, the $A_2$ And $B_2$ are determined as current calibration coefficients for the current calibration unit at the temperature $T_2$ and the flow goes to the next step. If the detection precision does not meet the preset precision requirement, a determination as to whether to write the current calibration coefficients to the current calibration unit is made. If yes, the flow goes back to the step f for retest; if not, it is determined that the current detection device does not meet the current detection precision requirement, and the current detection device needs to be replaced.

h. resistor values of the shunt at respective temperatures $T_1$ and $T_2$ are determined by the host computer, and with the temperature $T_1$ as a reference temperature, a resistance change rate of the shunt at the temperature $T_2$ is calculated based on the resistor values at the two temperatures, and the resistance-temperature characteristic curve of the shunt is determined according to the resistance change rate at the temperature $T_2$ and a resistance change rate at the temperature $T_1$.

i. current calibration coefficients at respective temperatures other than the temperatures $T_1$ and $T_2$ in an operating temperature range of the shunt are obtained according to the A1 And B1 at the temperature T1 and the resistance-temperature characteristic curve so as to obtain a mapping relationship between temperatures of the shunt and current calibration confidents, and the mapping relationship is written into the current calibration unit for implementing acquisition of a current calibration coefficient.

After the mapping relationship is written into the current calibration unit and calibration of the current detection device is completed, the calibrated current detection device shown in FIG. 7 can then be applied to a circuit that actually needs current detection for implementing detection and calibration of current in the circuit.

Figure 10:
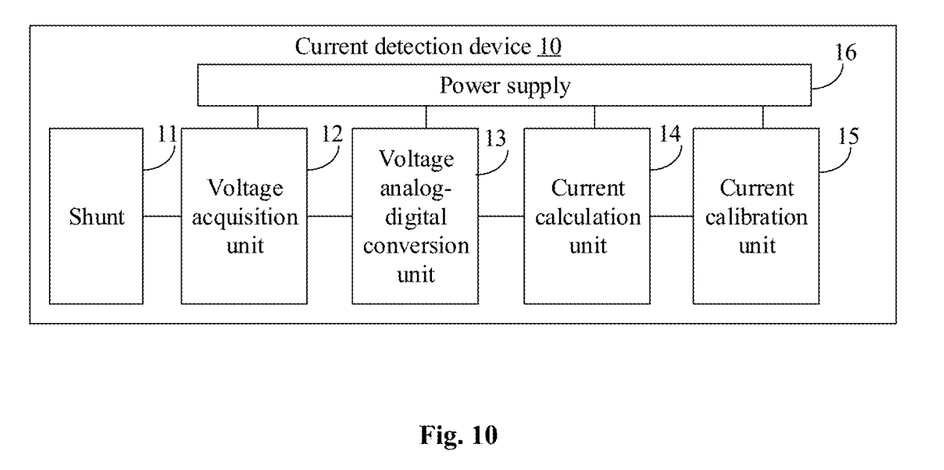
FIG. 10 is a schematic structural diagram of a current detection device according to an embodiment of the present disclosure.

There is also provided a current detection device according to embodiments of the present disclosure, as shown in FIG. 10. The current detection device 10 includes a shunt 11, a voltage acquisition unit 12, a voltage analog-digital conversion unit 13, a current calculation unit 14, a current calibration unit 15, and a power supply unit 16.

The shunt 11 is connected in series in a circuit that needs current detection. When a current in the circuit flows through the shunt 11, a voltage drop occurs across the shunt 11.

The voltage acquisition unit 12 is configured to collect a voltage analog signal across the shunt 11, that is, acquire a voltage signal of the shunt 11.

The voltage-to-digital conversion unit 13 is configured to perform an analog-to-digital conversion on the voltage analog signal and input the converted voltage value to the current detection unit 14.

The current calculation unit 14 is configured to calculate a current value $I_0$ of the circuit according to the voltage value and a nominal resistance value of the shunt 11, and input the $I_0$ to the current calibration unit 15.

The current calibration unit 15 is configured to calibrate the $I_0$ according to a pre-stored current calibration coefficient to obtain a calibrated current value I. The current calibration coefficient is obtained by connecting the shunt in series with the current source and calculating, according to a specified current value outputted by the current source and a detected current value calculated by the current calculation unit when a current with the specified current value flows through the shunt.

The power supply unit 16 is configured to provide an operating power for the current detection device 10. The power supply unit 16 is specifically configured to provide the voltage acquisition unit 12, the voltage analog-digital conversion unit 13, the current calculation unit 14 and the current calibration unit 15 with respective required operating power.

In the current detection device 10 according to embodiments of the present disclosure, the current calibration coefficient is obtained by connecting the shunt 11 in serious with the current source and calculating according to a specified current value output from the current source and a detected current value detected by the current detection unit 14 when a current with the specified current value flows through the shunt 11. That is, the current source is used as a current source for test and the current detection device 10 is tested. Specifically, a current with the specified current value output from the current source flows through the shunt 11, and then a current calibration coefficient is determined according to the specified current value and a detected current value calculated by the current calculation unit 11 upon detection by the current detection device of the specified current value. Since the current calibration coefficient is obtained based on a test for the current detection device 10, it is possible for the current detection device 10 according to embodiments of the present disclosure to improve accuracy of current detection in a circuit by detecting, using the current calculation unit 11, a current in a circuit and performing, using the current calibrating unit 15 in cooperation with the shunt, an calibration based on the current calibration coefficient.

From the foregoing descriptions, it can be seen that the current calibration coefficient pre-stored in the current calibration unit 15 according to embodiments of the present disclosure may be a current calibration coefficient for the detection device calculated after the detection device 10 is tested by the current calibration coefficient measurement device according to any of embodiments of the present disclosure.

In embodiments of the present disclosure, the circuit refers to a circuit in which a current is flowing through and that needs current detection, including but not limited to a battery charge/discharge circuit and the like.

Figure 11:
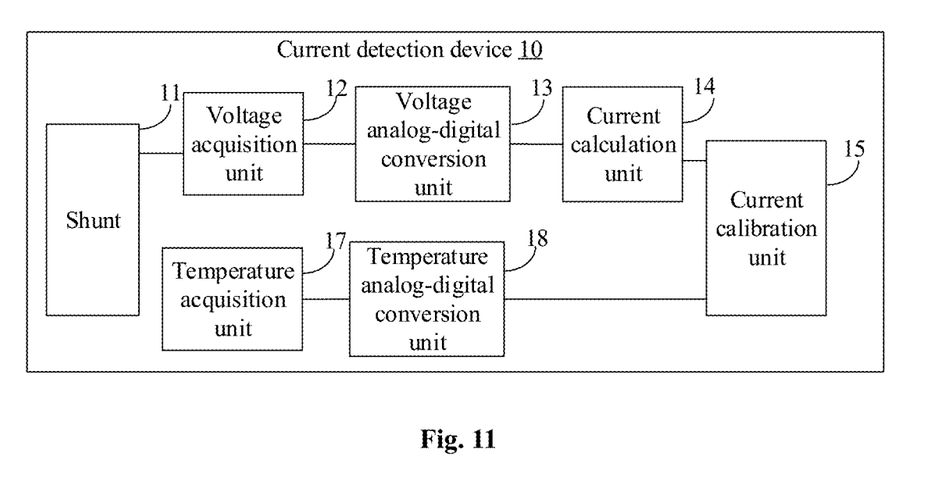
FIG. 11 is a schematic structural diagram of a current detection device according to another embodiment of the present disclosure.

In an embodiment of the present disclosure, the current detection device 10 may further include a temperature acquisition unit 17 and a temperature analog-to-digital conversion unit 18, as shown in FIG. 11 (the power supply unit 16 is not shown in the figure). The power supply unit 16 is further configured to provide an operating power for the temperature acquisition unit 17 and the temperature analog-to-digital conversion unit 18.

The temperature acquisition unit 17 is configured to acquire a temperature analog signal of the shunt 11.

The temperature analog-to-digital conversion unit 18 is configured to perform an analog-to-digital conversion on the temperature analog signal and input the converted temperature value to the current calibration unit 15.

The current calibration unit 15 is further configured to determine, according to the temperature value and a pre-stored mapping relationship between temperatures of the shunt current calibration coefficients, a current calibration coefficient, and calibrate the $I_0$ according to the determined current calibration coefficient to obtain I. The mapping relationship between temperatures of the shunt and current calibration coefficients is obtained according to a temperature characteristic curve of the shunt in a set temperature range and a current calibration coefficient calculated based on a specified current value and a detected current value when the ambient temperature of the current detection device is at the reference temperature $T_1$ according to temperature characteristic of the shunt. The set temperature range has a minimum value of $T_1$ and a maximum value of $T_2$, $T_2 > T_1$.

In the case that the current calibration coefficient stored in the current calibration unit 15 is a current calibration coefficient related to a temperature, that is, related to the above mapping relationship, during current detection and calibration, a present temperature value of the shunt is acquired and then a corresponding current calibration coefficient is determined according to the temperature value so that the calibrated I maximally approximates a current value in the circuit under test.

In an embodiment of the present disclosure, the foregoing mapping relationship pre-stored in the current calibration unit 15 may be a mapping relationship between temperatures of the shunt 11 and current calibration coefficients that is obtained by the current calibration coefficient measurement device 100 including the incubator according to embodiments of the present disclosure performing a test on a current calibration coefficient of the current detection device 10.

Figure 12:
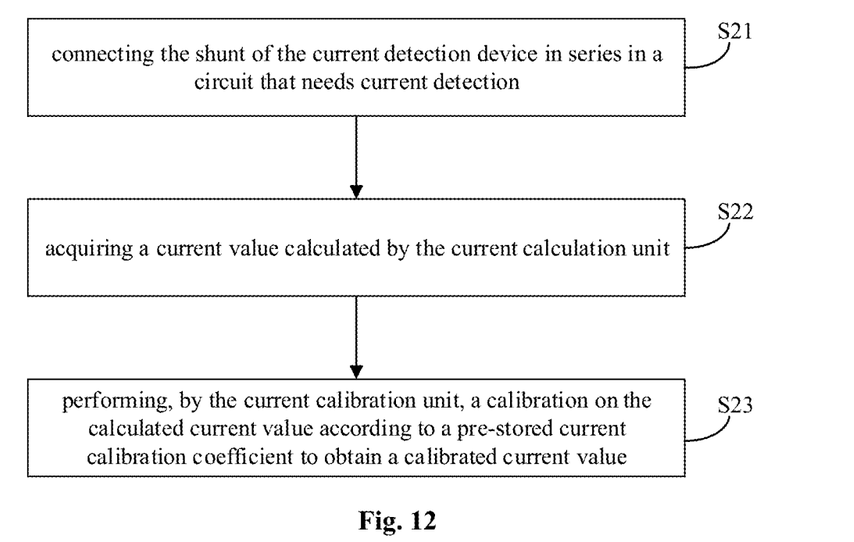
FIG. 12 is a schematic flow chart of a current detection method in an embodiment of the present disclosure.

Based on the current detection device according to embodiments of the present disclosure, there is also provided a current detection method according to embodiments of the present disclosure. As shown in FIG. 12, the current detection method mainly include the following steps: step S21: connecting the shunt of the current detection device in series in a circuit that needs current detection; step S22: acquiring a current value calculated by the current calculation unit; and step S23: performing a calibration on the detected current value according to the current calibration coefficient pre-stored by the current calibration unit to obtain a calibrated current value.

It should be noted that the current detection method according to embodiments of the present disclosure is applicable to the current detection device 10 according to embodiments of the present disclosure, and is also applicable to other devices that performs current detection based on principle of a shunt. By this method, a current value detected by the current detection device is corrected so that the corrected current value is closer to an actual current value in the circuit.

In an embodiment of the present disclosure, in the case that there is a pre-stored mapping relationship between temperatures of the shunt and current calibration coefficients in the current calibration unit, the performing a calibration on a calculated current value according to the current calibration coefficient may include: acquiring a temperature value of the shunt; and determining a corresponding current calibration coefficient according to the temperature value and the mapping relationship, and performing a calibration on the calculated current value based on the determined corresponding current calibration coefficient.

There is also provided a battery pack according to embodiments of the present disclosure. The battery pack includes the current detection device according to embodiments of the present disclosure. The circuit may be a charge or discharge circuit of the battery pack There is also provided a battery management system according to embodiments of the present disclosure. The battery management system includes the current detection device according to embodiments of the present disclosure.

Figure 13:
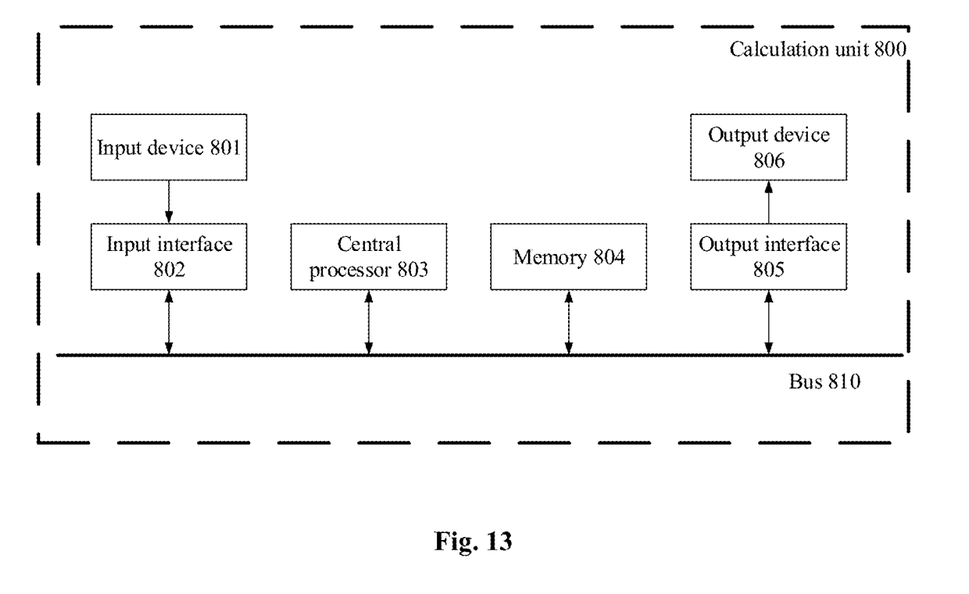
FIG. 13 shows a block diagram of an exemplary hardware architecture of a computing device capable of implementing a current detection method and device in accordance with embodiments of the present disclosure.

At least a portion of the current detection device and method described in conjunction with FIGS. 10-12 may be implemented by a computing device 800. As shown in FIG. 13, the computing device 800 may include an input device 801, an input interface 802, a central processor 803, a memory 804, an output interface 805, and an output device 806. The input interface 802, the CPU 803, the memory 804, and the output interface 805 are connected to each other through a bus 810. The input device 801 and the output device 806 are connected to the bus 810 via the input interface 802 and the output interface 805, respectively, and are connected to other components of the computing device 800. Specifically, the input device 801 receives input information from outside and transmits the input information to the CPU 803 through the input interface 802. The CPU 803 processes the input information based on computer-executable instructions stored in the memory 804 to generate an output information. The output information then temporarily or permanently store the output information in the memory 804 and then is transmitted to the output device 806 through the output interface 805. The output device 806 outputs the output information to outside of the computing device 800 for use by a user.

That is, the computing device 800 shown in FIG. 13 may be implemented as a current sensing device, which may include a processor and a memory. The memory is configured to store executable program codes. The processor is configured to read the executable program codes stored in the memory to execute the current detection method according to any of the above embodiments.

There is also provided a computer readable storage medium having stored thereon computer instructions which cause, when executed on a computer, the computer to execute the current detection method provided in any of embodiments of the present disclosure.

The functional blocks shown in the block diagrams described above may be implemented as hardware, software, firmware, or a combination thereof. When implemented in hardware, it may for example be an electronic circuit, an application specific integrated circuit (ASIC), a suitable firmware, a plug-in, a function card or the like. When implemented in software, the elements of the present disclosure are programs or code segments used to perform the required tasks. The programs or code segments may be stored in a machine-readable medium or transmitted over a transmission medium or communication link through data signals carried in a carrier. The "machine-readable medium" may include any medium capable of storing or transmitting information. Examples of machine-readable media include electronic circuits, semiconductor memory devices, ROM, flash memory, erasable ROM (EROM), floppy disk, CD-ROM, optical disk, hard disk, fiber optic media, radio frequency (RF) link, and the like. The code segments may be downloaded via a computer network, such as the Internet, an intranet, or the like.

The invention may be embodied in other specific forms without departing from the spirit and essential characteristics thereof. For example, the algorithms described in the specific embodiments may be modified without departing from the basic spirit of the invention. The present embodiments are therefore to be considered in all respects as illustrative and not restrictive. The scope of the invention is defined by the appended claims rather than by the foregoing description, and all modifications fall within the meaning and equivalents of the claims are thus intended to be embraced by the scope of the invention.

What is claimed is:

1. A measurement device for measuring a current calibration coefficient, comprising a host computer and a current source;

wherein the host computer is configured to:

control, when ambient temperature of a current detection device is at a preset temperature within an operation temperature range of a shunt of the current detection device, the current source to output a current with a preset current value to the current detection device, wherein the current detection device is used for performing a detection of a current in a current circuit requiring current detection;

receive a calibrated current value sent by the current detection device, wherein the calibrated current value is determined according to a detected current value corresponding to the preset current value detected by the current detection device and a predetermined current calibration coefficient, wherein the predetermined current calibration coefficient is sent to the current detection device by the host computer;

calculate a measurement error of the current detection device according to the preset current value and the calibrated current value; and determine, when the measurement error is less than a preset current error, the predetermined current calibration coefficient as a current calibration coefficient of the current detection device.

2. The measurement device according to claim 1, wherein the host computer is further configured to:

acquire the predetermined current calibration coefficient, wherein the predetermined current calibration coefficient comprises a current calibration coefficient at a temperature T1 and a current calibration coefficient at a temperature T2, wherein the T1 is a reference temperature of a resistance-temperature characteristic curve of the shunt of the current detection device, and the T2 is any one temperature other than the T1 within the operation temperature range of the shunt;

wherein the predetermined current calibration coefficient is acquired by:

controlling the current source to output a first current with a first specified current value to the current detection device when ambient temperature of the current detection device is at the T1;

calculating, according to the first specified current value and a first detected current value detected by the current detection device, a current calibration coefficient at the T1, and determining, according to the current calibration coefficient at the T1 and the resistance-temperature characteristic curve of the shunt of the current detection device, a current calibration coefficient at the T2.

3. The measurement device according to claim 2, wherein the host computer is configured to:

control the current source to sequentially output currents with n different first specified current values at the T1;

acquire n first detected current values corresponding to the n different first specified current values, wherein n≥2; and calculate the current calibration coefficient at the T1 according to the n different first specified current values and the n first detected current value.

4. The measurement device according to claim 3, wherein the host computer is configured to calculate, according to the n different first specified current values and the n first detected current values, the current calibration coefficient at the T1 by a least-square linear fitting method, and wherein the current calibration coefficient comprises a linear calibration coefficient and a constant calibration coefficient.

5. The measurement device according to claim 2, wherein the host computer is further configured to:

control the current source to output the current with a second specified current value when the ambient temperature of the current detection device is at the $T_2$;

acquire a second detected current value at the T2 detected by the current detection device;

calculate a first actual resistance value $R_1$ of the shunt at the $T_1$ according to the first specified current value, the first detected current value at the $T_1$ and a nominal resistance value of the shunt;

calculate a second actual resistance value $R_2$ of the shunt at the $T_2$ according to the second specified current value, a second detected current value at the $T_2$ and the nominal resistance value of the shunt;

calculate, a resistance-temperature coefficient of the shunt at the $T_2$ according to the $R_1$ and $R_2$, and determine the resistance-temperature characteristic curve of the shunt based on the resistance-temperature coefficient at the $T_2$ and a resistance-temperature coefficient at the $T_1$, wherein the resistance-temperature coefficient at the T1 is zero.

6. The measurement device according to claim 5, wherein the host computer is configured to:

determine, a third actual resistance value $R_3$ of the shunt at the $T_2$ according to the $T_2$ and the resistance-temperature characteristic curve, and calculate the current calibration coefficient at the $T_2$ according to the $R_3$ and the current calibration coefficient at the $T_1$ by a formula:

$$A_3 = A_1 * R_3/R_1, B_3 = B_1$$

where $A_1$ is a linear calibration coefficient at the $T_1$, $A_3$ is a linear calibration coefficient at the $T_2$, $B_1$ is a constant calibration coefficient at the $T_1$, and $B_3$ is a constant calibration coefficient at the $T_2$.

7. The measurement device according to claim 2, wherein the host computer is further configured to control the current source to output a first actual current value corresponding to the first specified current value; and calculate, according to the first detected current value and the first actual current value corresponding to the first specified current value, the current calibration coefficient at the $T_1$ of the current detection device.

* * * * *